(12) United States Patent
Shimura

(10) Patent No.: US 11,973,194 B2
(45) Date of Patent: Apr. 30, 2024

(54) CONTROL APPARATUS, INFORMATION PROCESSING APPARATUS, AND STORAGE CELL RETRIEVAL SYSTEM

(71) Applicant: KYOCERA Corporation, Kyoto (JP)

(72) Inventor: Toshiyuki Shimura, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 890 days.

(21) Appl. No.: 17/040,540

(22) PCT Filed: Mar. 22, 2019

(86) PCT No.: PCT/JP2019/012170
§ 371 (c)(1),
(2) Date: Sep. 23, 2020

(87) PCT Pub. No.: WO2019/188816
PCT Pub. Date: Oct. 3, 2019

(65) Prior Publication Data
US 2021/0028501 A1 Jan. 28, 2021

(30) Foreign Application Priority Data
Mar. 26, 2018 (JP) .................. 2018-058890

(51) Int. Cl.
*H01M 10/42* (2006.01)
*G01R 31/392* (2019.01)
(52) U.S. Cl.
CPC .......... *H01M 10/42* (2013.01); *G01R 31/392* (2019.01); *H01M 10/4285* (2013.01)
(58) Field of Classification Search
CPC .. G06Q 30/0633; G06Q 10/087; G06Q 50/06; G01R 31/392; H01M 10/42; H01M 10/4285; H01M 10/488; H01M 2010/4278; H02J 7/005; Y02E 60/10; Y02T 90/167
USPC ........................................................ 702/63
See application file for complete search history.

(56) References Cited

U.S. PATENT DOCUMENTS

| | | | |
|---|---|---|---|
| 9,720,478 B2 | 8/2017 | Hanafusa | |
| 10,403,936 B2* | 9/2019 | Kobayashi | .......... H01M 10/441 |
| 2010/0121588 A1 | 5/2010 | Elder et al. | |
| 2018/0269541 A1* | 9/2018 | Kobayashi | ................ H02J 3/32 |

FOREIGN PATENT DOCUMENTS

| | | |
|---|---|---|
| JP | 2014139725 A | 7/2014 |
| JP | 20157854 A | 1/2015 |
| JP | 2017130417 A | 7/2017 |
| JP | 201823282 A | 2/2018 |

* cited by examiner

Primary Examiner — John H Le
(74) Attorney, Agent, or Firm — HAUPTMAN HAM, LLP

(57) ABSTRACT

A control apparatus capable of controlling a storage cell includes a controller and a communication interface. The controller determines, based on the degradation state of the storage cell that is the control target, a condition on the degradation state of the storage cell. The communication interface transmits, to an information processing apparatus, a retrieval request to retrieve a storage cell to be a new control target, the retrieval request including the condition on the degradation state of the storage cell. The communication interface receives, from the information processing apparatus, a retrieval result including information of the storage cell retrieved based on the retrieval request.

11 Claims, 7 Drawing Sheets

FIG. 2

| Storage cell ID | User ID | Storage cell manufacturer ID | Model | Serial number | Initial capacity [kWh] | SOH [%] | SOH acquisition date | Storage capacity [kWh] | Availability of sale | Price |
|---|---|---|---|---|---|---|---|---|---|---|
| 0001 | A | E | HI123 | 7890 | 10 | 60 | 2020.11.30 | 6 | Available | ¥50,000 |
| 0002 | A | E | HI124 | 8901 | 5 | 50 | 2020.09.15 | 2.5 | Available | ¥20,000 |
| 0003 | B | F | JK133 | 9012 | 10 | 50 | 2020.01.23 | 5 | Unavailable | - |
| 0004 | C | G | LM126 | 0012 | 10 | 90 | 2020.02.23 | 9 | Unavailable | - |
| 0005 | C | G | LM126 | 0123 | 5 | 70 | 2020.03.21 | 3.5 | Available | ¥30,000 |
| 0006 | D | E | HI123 | 1234 | 5 | 60 | 2020.10.26 | 3 | Available | ¥25,000 |

FIG. 6

Storage cell list

| Item number | User ID | Storage cell manufacturer ID | Model | Serial number | Initial capacity [kWh] | SOH [%] | SOH acquisition date | Price | |
|---|---|---|---|---|---|---|---|---|---|
| 1 | A | E | HI123 | 7890 | 10 | 60 | 2020.11.30 | ¥50,000 | Start transaction |
| 2 | A | E | HI124 | 8901 | 5 | 50 | 2020.09.15 | ¥20,000 | Start transaction |
| ... | D | E | HI123 | 1234 | 5 | 60 | 2020.10.26 | ¥25,000 | Start transaction |

CONTROL APPARATUS, INFORMATION PROCESSING APPARATUS, AND STORAGE CELL RETRIEVAL SYSTEM

CROSS-REFERENCE TO RELATED APPLICATION

The present application is a national phase of International application No. PCT/JP2019/012170, filed Mar. 22, 2019 which claims priority to and the benefit of Japanese Patent Application No. 2018-058890 filed Mar. 26, 2018.

TECHNICAL FIELD

The present disclosure relates to a control apparatus, an information processing apparatus, and a storage cell retrieval system.

BACKGROUND

Techniques for controlling a plurality of storage cells are known. For example, there is a control apparatus that controls the charging and discharging of a plurality of storage cells using degradation information of the storage cells.

SUMMARY

A control apparatus according to an embodiment of the present disclosure is capable of controlling a storage cell and includes a controller and a communication interface. The controller is configured to determine, based on a degradation state of the storage cell that is a control target, a condition on the degradation state of the storage cell. The communication interface is configured to transmit, to an information processing apparatus, a retrieval request to retrieve a storage cell to be a new control target, the retrieval request including the condition on the degradation state of the storage cell, and to receive, from the information processing apparatus, a retrieval result including information of a storage cell retrieved based on the retrieval request.

An information processing apparatus according to an embodiment of the present disclosure communicably connects to a control apparatus capable of controlling a storage cell. The information processing apparatus is configured to receive, from a first control apparatus, a registration request to register a degradation state of the storage cell that is a control target of the first control apparatus, and when the registration request is received, to store the degradation state in a database including information of storage cells. The information processing apparatus is configured to receive, from a second control apparatus, a retrieval request to retrieve a storage cell to be a new control target, the retrieval request including a condition on the degradation state of the storage cell, and when the retrieval request is received, to search the database based on the retrieval request. The information processing apparatus is configured to transmit, to the second control apparatus, a retrieval result including the information of the storage cell that is retrieved.

A storage cell retrieval system according to an embodiment of the present disclosure includes a control apparatus capable of controlling a storage cell and an information processing apparatus configured to communicably connect to the control apparatus. The control apparatus is configured to determine, based on a degradation state of the storage cell that is a control target, a condition on the degradation state of the storage cell and to transmit, to the information processing apparatus, a retrieval request to retrieve a storage cell to be a new control target, the retrieval request including the condition on the degradation state of the storage cell. The information processing apparatus is configured to search a database that includes information on storage cells based on the retrieval request when the retrieval request is received from the control apparatus and to transmit, to the control apparatus, a retrieval result including the information of the storage cell that is retrieved.

BRIEF DESCRIPTION OF THE DRAWINGS

In the accompanying drawings:

FIG. 2 illustrates storage cell information stored by an information processing apparatus according to an embodiment of the present disclosure;

FIG. 6 is another example screen displayed by a control apparatus according to an embodiment of the present disclosure.

DETAILED DESCRIPTION

Conventionally, a control apparatus capable of controlling a plurality of storage cells has typically been used to add, remove, or replace storage cells in accordance with usage in consumer facilities. This configuration enables adjustment of the overall storage capacity and the like. When a new storage cell is installed and added to the control targets of the control apparatus, however, a difference in the degradation state, capabilities, or the like as compared to the other previously installed storage cells may prevent the capabilities of the new storage cell, such as the storage capacity, from being sufficiently achieved. Demand therefore exists for a control apparatus and information processing apparatus that increase the usefulness of a technique for controlling storage cells by providing information of a new storage cell to be controlled based on information of other already installed storage cells. In response to this demand, the present disclosure provides a control apparatus, an information processing apparatus, and a storage cell retrieval system that increase the usefulness of a technique for controlling storage cells.

Embodiments of the present disclosure are described below.

Figure 1:
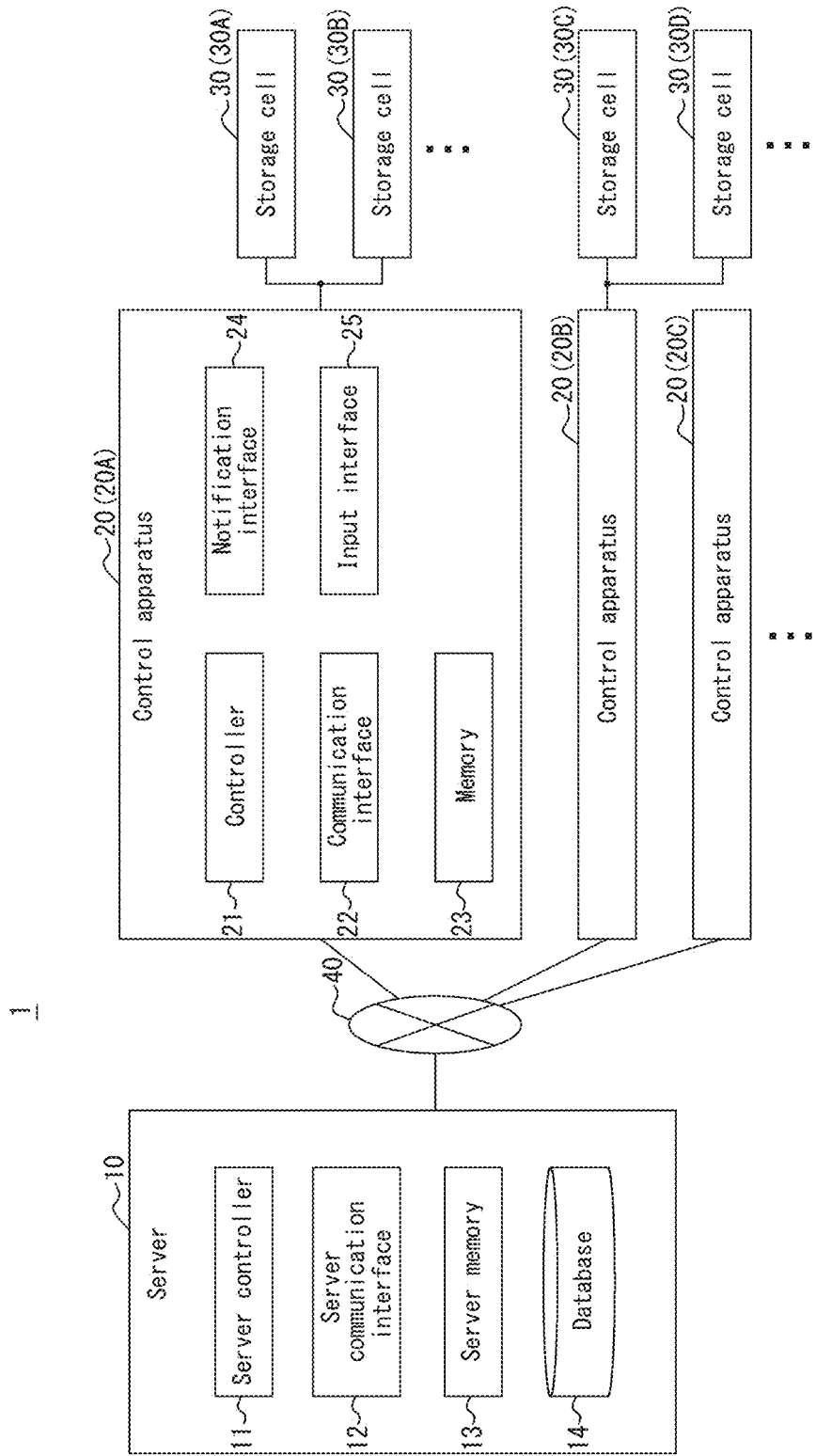
FIG. 1 is a block diagram of a storage cell retrieval system according to an embodiment of the present disclosure.
Figure 3:
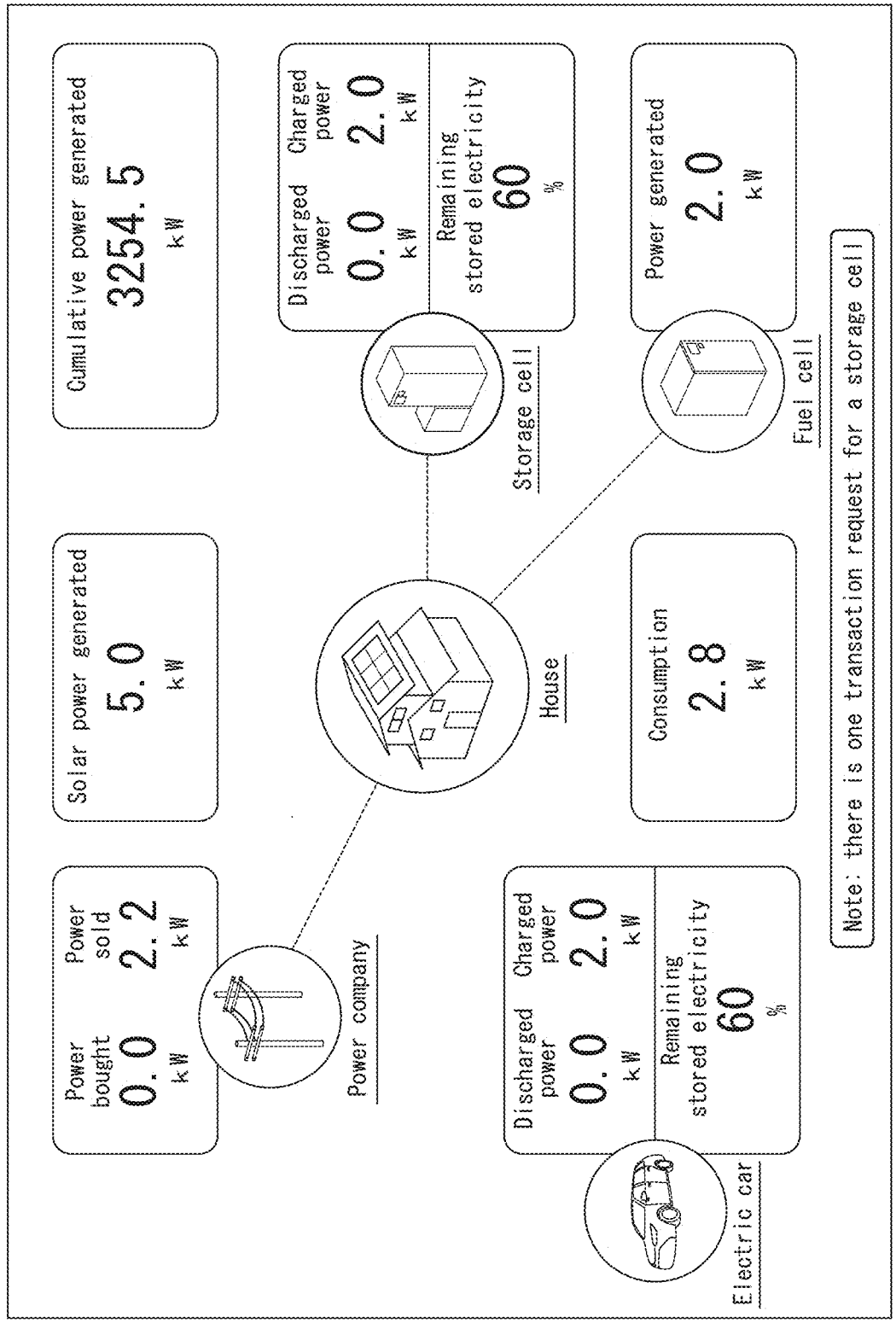
FIG. 3 is an example screen displayed by a control apparatus according to an embodiment of the present disclosure.
Figure 4:
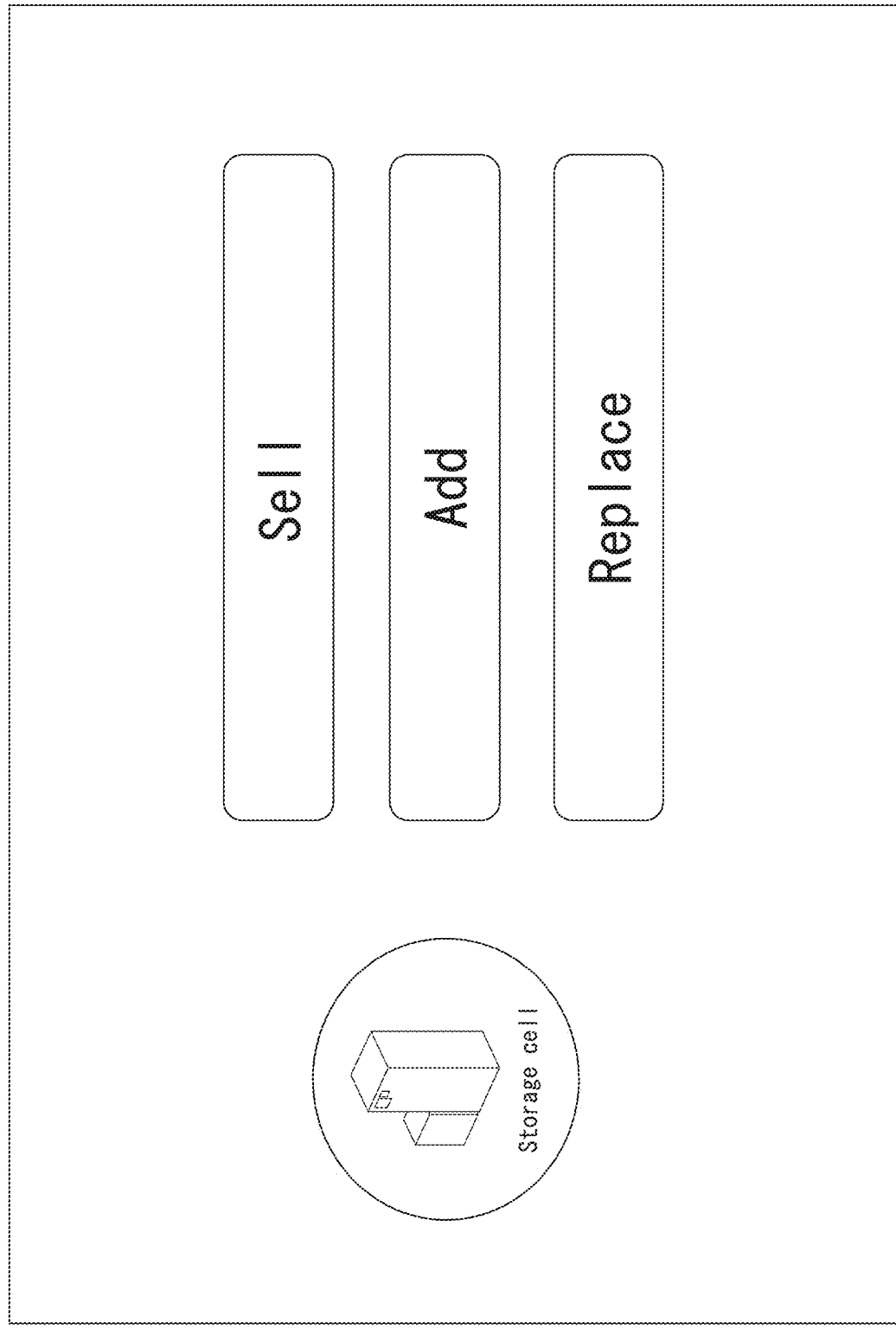
FIG. 4 is another example screen displayed by a control apparatus according to an embodiment of the present disclosure.

An overview of a storage cell retrieval system 1 according to an embodiment of the present disclosure is now described with reference to FIG. 1. A server 10 and three control apparatuses 20A, 20B, 20C are included in the storage cell retrieval system 1. The control apparatuses 20A, 20B, 20C are referred to below collectively as the control apparatus 20 when no distinction therebetween is made. For the sake of simplicity, one server 10 and three control apparatuses 20 are illustrated in FIG. 1, but the number of servers 10 and control apparatuses 20 may be freely set.

The server 10 is an information processing apparatus, such as a server, used by a storage cell retrieval service provider, for example. The control apparatus 20 is an information processing apparatus capable of controlling storage cells, and examples include an energy management system (EMS), such as a home energy management system (HEMS), a building energy management system (BEMS), a factory energy management system (FEMS), and a community energy management system (CEMS); a battery management system (BMS); a power control apparatus; a mobile phone; a smartphone; a tablet; a personal computer (PC); a remote control; and a smart speaker. The control target of the control apparatus 20 is not limited to storage cells. For example, a power load apparatus, a distributed power supply, a fuel cell, a heat pump type water heater, a smart meter, an electric vehicle, or the like may be included among the control targets of the control apparatus 20. The control apparatus 20 is also referred to as a power management apparatus. In FIG. 1, the control apparatus 20A is connected to storage cells 30A, 30B in a controllable manner. The control apparatus 20B is connected to storage cells 30C, 30D in a controllable manner. The storage cells 30A, 30B, 30C, 30D are referred to below collectively as the storage cell 30 when no distinction therebetween is made. The control apparatus 20 is used by the user of the storage cell 30.

In the storage cell retrieval system 1, the server 10 and the control apparatus 20 are communicably connected over a network 40. The control apparatus 20 is connected to the storage cells 30 in a controllable manner. The control apparatus 20 calculates the degradation state of the connected storage cells 30. When a user wishing to install a new storage cell operates the control apparatus 20, the control apparatus 20 determines a condition on the degradation state of the storage cell based on the degradation state of the storage cells 30 that are control targets. The control apparatus 20 transmits, to the server 10, a retrieval request to retrieve a storage cell to be a new control target, the retrieval request including the condition on the degradation state of the storage cell. The server 10 includes a database 14 that includes information of storage cells. Upon receiving the above-described retrieval request from the control apparatus 20, the server 10 searches the database based on the retrieval request. The server 10 transmits the retrieval result including the retrieved information of the storage cell to the control apparatus 20. The control apparatus 20 displays the received retrieval result. Based on the displayed retrieval result, the user proceeds with selection, purchasing, and the like of a storage cell to be newly installed.

The server 10 and the control apparatus 20 cooperate to execute the processing related to storage cell retrieval in the present disclosure. For example, the server 10 and the control apparatus 20 may divide up and execute a sequence of processes. Alternatively, the server 10 and the control apparatus 20 may each execute identical processing. The server 10 and the control apparatus 20 may end the processing when the processing results of the identical processing match between the server 10 and the control apparatus 20. Conversely, when the processing results do not match between the server 10 and the control apparatus 20, the server 10 and the control apparatus 20 may, for example, end the identical processing while treating the processing results of the server 10 as accurate or may revert to a point before execution of the processing. This configuration reduces the probability of immediate interruption of the process when, for example, the quality of communication between the server 10 and the control apparatus 20 is temporarily reduced. Furthermore, if fraudulent processing is performed on the control apparatus 20, such as overwriting a parameter, the probability of being able to exclude the fraudulent processing increases.

(Configuration of Server)

The configuration of the server 10 is described in detail. The server 10 includes a server controller 11, a server communication interface 12, a server memory 13, and the database 14.

While details are provided below, the server controller 11 includes one or more processors that provide control and processing capabilities for implementing the functions of the server 10. The server controller 11 may be a processor, such as a central processing unit (CPU), that executes programs with prescribed control procedures or may be a dedicated processor specialized for the processing of each function.

The server communication interface 12 includes an interface for transmitting and receiving information by communicating in a wired or wireless manner with an external apparatus. The server communication interface 12 may, for example, include a wireless local area network (LAN) communication module, a wired LAN communication module, a controller area network (CAN) communication module, or the like. In the present embodiment, the server communication interface 12 is communicably connected to the control apparatus 20 over the network 40. In this way, the server 10 transmits and receives information to and from the control apparatus 20.

The server memory 13 includes, for example, a semiconductor memory, a magnetic memory, or an optical memory. The server memory 13 may, for example, function as a main storage apparatus or an auxiliary storage apparatus. The server memory 13 may also be a cache memory or the like of the processor included in the server controller 11. The server memory 13 may be a volatile storage apparatus or a non-volatile storage apparatus. The server memory 13 stores information and programs used for control and processing to implement the functions of the server 10. At least a portion of the information and programs stored in the server memory 13 may be shared and synchronized with the control apparatus 20.

The database 14 stores information of storage cells. Upon receiving a retrieval request from the server controller 11, the database 14 searches the information in the database 14 based on conditions included in the retrieval request. The database 14 transmits the retrieved information to the server controller 11 as the retrieval result. Information received from the control apparatus 20 may be included in the storage cell information stored in the database 14. Alternatively, additional information that the server controller 11 acquires via a network from an external apparatus, such as a Web server of the manufacturer, based on information received from the control apparatus 20 may be included in the storage cell information stored in the database 14. Examples of the information stored in the database 14 are described below.

(Storage Cell Information)

The storage cell information is created for each storage cell that is a target of retrieval. The storage cell that is the target of retrieval in the present disclosure may be any storage cell used for charging and discharging of electricity. The storage cell may be used for any purpose and may, for example, be a household storage cell; a storage cell in an electric vehicle, hybrid vehicle, or mobile phone; or a mobile battery. In the present embodiment, the storage cell is described as being retrieved, stored, and managed in individual units provided or sold by a storage cell manufacturer for these purposes, but this example is not limiting. The storage cell may be retrieved, stored, and managed in units of cells, which are the smallest unit used for charging and discharging electricity, or in units of modules in which a plurality of cells is connected.

Information included in the storage cell information is described with reference to FIG. 2. The storage cell information may include any information that is unique to the storage cell and is used for retrieval. For example, the storage cell information includes a storage cell identifier (ID), user ID, storage cell manufacturer ID, model, serial number, initial capacity, degradation state, degradation state acquisition date, storage capacity, availability of sale, and price.

The storage cell ID is any information capable of uniquely identifying the storage cell information. The storage cell uniquely identified by the storage cell ID is also referred to below simply as a storage cell.

The user ID is any information capable of uniquely identifying the user of the storage cell. The user uniquely identified by the user ID is also referred to below simply as the user. The user ID may be managed in association with information related to the user, such as the user's name, address, telephone number, e-mail address, and credit card or bank account used in storage cell transactions. The user ID may also be managed in association with information capable of uniquely identifying the control apparatus 20. In this way, the server 10 may use the user ID to identify the control apparatus 20 that the user uses to control the storage cell.

The storage cell manufacturer ID is information capable of uniquely identifying the manufacturer that produces or sells the storage cell. The storage cell manufacturer uniquely identified by the storage cell manufacturer ID is also referred to below simply as a storage cell manufacturer. The model is information for identifying the product specifications of the storage cell, the battery characteristics, and the like provided by the storage cell manufacturer. The serial number is information, provided by the storage cell manufacturer, capable of uniquely identifying the storage cell. These pieces of information may be used to narrow down the search when retrieving a storage cell or to identify a storage cell during a storage cell sales transaction or the like carried out after retrieval.

The initial capacity is information indicating the chargeable capacity (kWh) when the storage cell is shipped. The initial capacity may be the capacity based on a value measured by the control apparatus 20 or may be the design capacity (DC) published by the storage cell manufacturer or the like. In the present disclosure, the design capacity is used as the initial capacity. The initial capacity is used together with information such as the degradation state, described below, to narrow down storage cells when matching a storage cell.

The degradation state is information indicating the degree of degradation of a storage cell. The degradation state is also referred to as a state of health (SOH). The SOH may be represented by Equation 1 below as a ratio (%) of the current full charge capacity (FCC) to the design capacity.

$$\text{SOH (\%)} = \text{FCC}/\text{DC} \times 100 \qquad \text{Equation 1}$$

In this case, an SOH of 100% indicates that the storage cell has not degraded. The lower the SOH is, the more the degradation of the storage cell has progressed. The FCC may be calculated by any method. For example, the FCC may be the discharge power amount measured when the storage cell is discharged from a fully charged state to a fully discharged state. The FCC may also be estimated based on the current, duration, or the like required for charging and discharging.

The degradation state acquisition date is information indicating the date when the SOH of the storage cell was calculated. The degradation state acquisition date is also referred to below as the SOH acquisition date. When a certain period has elapsed from the SOH acquisition date included in the storage cell information, the server controller 11 may estimate that degradation of the storage cell has progressed from the degradation state included in the storage cell information. The server controller 11 may issue a request to update the SOH information to the user of the storage cell, or the control apparatus 20 used by the user, when a certain period has elapsed from the SOH acquisition date. The server controller 11 may remove the storage cell from the retrieval targets when a certain period has elapsed from the SOH acquisition date.

The storage capacity is information indicating the capacity the storage cell has for storage at the current time. The storage capacity may be calculated with Equation 2 below, using the above-described initial capacity and SOH. Alternatively, the storage capacity may be the FCC received from the control apparatus 20.

$$\text{storage capacity (kWh)} = \text{initial capacity (kWh)} \times \text{SOH (\%)}/100 \qquad \text{Equation 2}$$

The availability of sale is information indicating whether the storage cell is available for sale. The information on the availability of sale may, for example, be registered based on information indicating whether the user of a storage cell for which a sales transaction has not begun wishes to sell the storage cell. The server controller 11 may, for example, set the availability of sale to "unavailable" for a storage cell currently involved in a sales transaction or a storage cell for which a sales transaction was already completed. The server controller 11 may remove the information of a storage cell from the retrieval targets when the availability of sale is set to "unavailable".

The price is information indicating an amount of money related to a storage cell transaction. The information on the price may, for example, include a desired sales price set by the user of the storage cell. The information on the price may, for example, include the highest price among desired purchase prices presented by users wishing to purchase the storage cell. Furthermore, the actual sales price may be set as the price of a storage cell for which a sales transaction was completed.

The control performed by the server controller 11 for the functions of the server 10 is described below. When the server controller 11 receives, from the control apparatus 20, a registration request to register the degradation state of the storage cell 30 that is the control target of the control apparatus 20, the server controller 11 may store the degradation state in a database including information of storage cells. Any information may be included in the registration request to register the degradation state of the storage cell 30. The above-described SOH (%) may be included in the registration request to register the degradation state of the storage cell 30, or information for calculating the SOH may be included, such as the FCC or discharge power amount of the storage cell 30, or the current, duration, or the like required for charging and discharging the storage cell 30. When the server controller 11 receives information for calculating the SOH, the server controller 11 may calculate the SOH of the storage cell 30 based on the information and store the calculated SOH in the database as the degradation state.

The above-described examples of storage cell information may be included in the registration request to register the degradation state of the storage cell 30. For example, the storage cell ID may be included in the registration request to register the degradation state of the storage cell 30. The server controller 11 may use the storage cell ID included in the registration request to judge whether the information of the storage cell 30 that is the target of the registration request is stored in the database. When the information of the storage cell 30 that is the target of the registration request is not stored in the database, the server controller 11 may newly create the information of the storage cell 30. When the information of the storage cell 30 that is the target of the registration request is already stored in the database, the server controller 11 may update the information of the storage cell 30. When the SOH has not been updated for a predetermined period of time based on information such as the SOH acquisition date included in the information of the storage cell 30, the server controller 11 may transmit a request to update the degradation state of the storage cell 30 to the control apparatus 20 that has the storage cell 30 as a control target.

When the server controller 11 receives, from the control apparatus 20, a retrieval request to retrieve a storage cell to be a new control target, the retrieval request including a condition on the degradation state of the storage cell, the server controller 11 searches the database 14 based on the retrieval request. The server controller 11 may search the database 14 after narrowing down the retrieval targets based on the information included in the retrieval request, such as the condition on the degradation state. The server controller 11 transmits the retrieval result including the retrieved information of the storage cell to the control apparatus 20.

A condition other than the degradation state of the storage cell may be included in the retrieval request. A condition related to the above-described examples of storage cell information, for example, may be included in the retrieval request in addition to the condition on the degradation state of the storage cell. In this case, the server controller 11 may search the database 14 based on a combination of conditions included in the retrieval request. Furthermore, the server controller 11 may retrieve one storage cell satisfying the condition included in the retrieval request or retrieve a combination of storage cells that together satisfy the condition included in the retrieval request. A condition on the storage capacity of the storage cell, for example, may be included in the retrieval request. In this case, the server controller 11 may retrieve one storage cell satisfying the storage capacity of the retrieval request or may retrieve a plurality of storage cells whose combined storage capacity satisfies the storage capacity of the retrieval request. In cases such as when no single storage cell satisfies the condition on storage capacity designated by the user, or when a single storage cell satisfies the condition on storage capacity designated by the user but is expensive, the user can consider purchasing a combination of storage cells.

The server 10 may be used in a storage cell transaction between users based on the above-described retrieval result. When the server controller 11 receives a transaction request, from the control apparatus 20, designating the storage cell 30 included in the retrieval result, the server controller 11 transmits the transaction request to another control apparatus 20 that controls the storage cell 30. Specifically, when the server controller 11 receives a transaction request designating a storage cell 30, the server controller 11 may search the database 14 based on information, such as the storage cell ID, included in the transaction request. The server controller 11 may use the user ID included in the retrieved information of the storage cell to identify the recipient control apparatus 20 and transmit the transaction request to the control apparatus 20.

(Configuration of Control Apparatus)

The configuration of the control apparatus 20 is described in detail. As illustrated in FIG. 1, the control apparatus 20 includes a controller 21, a communication interface 22, a memory 23, a notification interface 24, and an input interface 25.

While details are provided below, the controller 21 includes one or more processors that provide control and processing capabilities for implementing the functions of the control apparatus 20. The controller 21 may be a processor, such as a CPU, that executes programs with prescribed control procedures or may be a dedicated processor specialized for the processing of each function.

The communication interface 22 includes an interface for transmitting and receiving information by communicating in a wired or wireless manner with an external apparatus. The communication interface 22 may, for example, include a wireless LAN communication module, a wired LAN communication module, a CAN communication module, or the like. In the present embodiment, the communication interface 22 is communicably connected to the server 10 over the network 40. In this way, the control apparatus 20 transmits and receives information to and from the server 10. The communication interface 22 also communicably connects to the storage cell 30. In this way, the control apparatus 20 transmits and receives information to and from the storage cell 30.

The memory 23 includes, for example, a semiconductor memory, a magnetic memory, or an optical memory. The memory 23 may, for example, function as a main storage apparatus or an auxiliary storage apparatus. The memory 23 may also be a cache memory or the like of the processor included in the controller 21. The memory 23 may be a volatile storage apparatus or a non-volatile storage apparatus. The memory 23 stores information and programs used for control and processing to implement the functions of the control apparatus 20. At least a portion of the information and programs stored in the memory 23 may be shared and synchronized with the server 10. The memory 23 stores information and programs used for processing to retrieve a storage cell. The memory 23 may store a portion or all of the retrieval result or storage cell information transmitted from the server 10.

The notification interface 24 provides notification by images, sound, vibration, lights being turned on, and the like. The notification interface 24 may, for example, include at least one of a display device, a speaker, an oscillator, a light, or the like. The display device can, for example, be a liquid crystal display, an organic EL display, or the like. When the notification interface 24 is a display device, the notification interface 24 may display the retrieval result received from the server 10 based on control by the controller 21. When the notification interface 24 is a speaker, the notification interface 24 may output the retrieval result received from the server 10 as audio based on control by the controller 21.

The input interface 25 can receive input operations from the user. The input interface 25 may, for example, include an input device such as a touch panel provided integrally with the display device of the notification interface 24, a keyboard, a mouse, a camera, a microphone, or the like. Upon being operated by the user, the input interface 25 transmits the user operation to the controller 21 as electronic information. At least one of the notification interface 24 and the input interface 25 may, for example, be provided in a remote control, tablet, personal computer, or the like physically separated from the control apparatus 20.

The control performed by the controller 21 for the functions of the control apparatus 20 is described below. The controller 21 controls the storage cell 30. The controller 21 transmits and receives information for controlling the storage cell 30 to and from the storage cell 30 via the communication interface 22. Any processing related to operation of the storage cell 30 is included in the control of the storage cell 30. For example, the control of the storage cell 30 may include activation, suspension, charging, or discharging of the storage cell; communication; management of operation plans; information provision; or the like. The control of the storage cell 30 is not limited to direct control and may be indirect control via another control apparatus such as a BMS. For example, the control apparatus 20 may control the storage cell 30 indirectly with another control apparatus by transmitting a control instruction of the storage cell 30 to the other control apparatus. The controller 21 stores information necessary for control of the storage cell 30 in the memory 23.

Control related to processing for the controller 21 to register information of the storage cell 30 that is the control target in the server 10 is described below. The controller 21 calculates the degradation state of the storage cell 30 that is the control target. For example, the controller 21 calculates the above-described SOH (%) as the degradation state of the storage cell 30. The controller 21 may, for example, acquire information necessary for calculating the SOH, such as the current FCC of the storage cell 30. When a plurality of storage cells 30A and 30B are included in the storage cells 30 that are control targets, the controller 21 may calculate the degradation state of each of the storage cells 30A and 30B or may calculate the degradation state of the storage cells 30 overall.

The controller 21 transmits a request to register the degradation state of the storage cell 30 that is the control target to the server 10 from the communication interface 22. The above-described SOH (%) may be included in the registration request to register the degradation state of the storage cell 30, or information for calculating the SOH may be included, such as the FCC or discharge power amount of the storage cell 30, or the current, duration, or the like required for charging and discharging the storage cell 30. Upon receiving the registration request, the server 10 stores the degradation state in the database. The controller 21 may transmit a request to register any information included in the above-described storage cell information together with the degradation state of the storage cell 30 that is the control target. The controller 21 may spontaneously transmit the registration request or may transmit the registration request based on user operation on the control apparatus 20 or a request from the server 10. For example, when the control apparatus 20 detects a storage cell 30 as a new control target, the control apparatus 20 may transmit a request to register the degradation state of the storage cell 30 to the server 10 from the communication interface 22 together with information such as the storage cell manufacturer, model, and serial number of the storage cell 30. Based on user operation by a user desiring to sell the storage cell 30, for example, the control apparatus 20 may transmit a request to register the degradation state of the storage cell 30 to the server 10 from the communication interface 22 together with information such as the availability of sale and the price of the storage cell 30. When the controller 21 receives a request to update the degradation state of the storage cell 30 from the server 10 due to the elapse of a predetermined period of time from the SOH acquisition date, for example, the controller 21 may transmit a request to register the current SOH and the SOH acquisition date to the server 10.

Control related to processing for the controller 21 to retrieve information of the storage cell 30 from the server 10 is described below. The controller 21 determines, based on the degradation state of the storage cell 30 that is the control target, a condition on the degradation state of the storage cell. The controller 21 may determine a condition on the degradation state of the storage cell based on the degradation state of any storage cell among the storage cells 30 that are the control targets. For example, when the user adds a new storage cell, the controller 21 may determine the condition on the degradation state of the storage cell based on the degradation state of all of the storage cells 30. When the user replaces a storage cell, the controller 21 may determine the condition on the degradation state of the storage cell based on the degradation state of the storage cell being replaced. At least one number or numerical range may be included in the condition on the degradation state of the storage cell. The controller 21 may, for example, set the average value, minimum value, or maximum value of the SOH of the storage cells 30A and 30B included in the storage cells 30 that are control targets as the condition on the degradation state of the storage cell. The controller 21 may set the range from the minimum value to the maximum value of the SOH of the storage cells 30A and 30B included in the storage cells 30 that are control targets or a range of plus or minus 10% of the average value of the SOH of the storage cells 30A and 30B as the condition on the degradation state of the storage cell.

The controller 21 transmits, to the server 10, a retrieval request to retrieve the storage cell to be a new control target from the communication interface 22, the retrieval request including the condition on the degradation state of the storage cell. The information included in a retrieval request is not limited to the condition on the degradation state. A condition on the storage capacity of the storage cell, for example, may be included in the retrieval request. Any conditions used to narrow down the storage cell that is to be the new control target may be included in the retrieval request, such as the number of storage cells, the storage cell manufacturer, the model, the price, or the like. Furthermore, the controller 21 may include, in the retrieval request, whether the user wishes for one storage cell to satisfy the above-described condition, or whether the above described-condition may be satisfied by a combination of storage cells.

Via the communication interface 22, the controller 21 receives, from the server 10, the retrieval result including the storage cell information retrieved based on the retrieval request. The controller 21 provides notification via the notification interface 24 of the information received from the server 10. In greater detail, the controller 21 provides notification, via the notification interface 24, of the retrieval result received from the server 10. Based on the retrieval result of which notification was provided, the user can proceed with selection, purchasing, and the like of a storage cell to be newly installed. The notification interface 24 may be a display, such as a display device, that displays information received from the server 10. This configuration enables the controller 21 to display information received from the server 10 on the display.

The control apparatus 20 may further be used in a transaction of a newly installed storage cell. The control apparatus 20 may notify the user of the control apparatus 20 of a transaction request for the storage cell 30 from another user. In greater detail, the controller 21 receives a transaction request designating the storage cell 30 that is the control target from the server 10 via the communication interface 22. The controller 21 provides notification of the received transaction request via the notification interface 24. The user can proceed with the transaction of the storage cell 30 based on the notified transaction request.

(Operation Example of Storage Cell Retrieval System)

Figure 5:
FIG. 5 is another example screen displayed by a control apparatus according to an embodiment of the present disclosure.

An example of processing related to storage cell retrieval is described below with reference to FIGS. 2 to 6. This processing is executed by cooperation between the server 10 and the control apparatus 20 included in the storage cell retrieval system 1 according to an embodiment of the present disclosure. As the notification interface 24 and the input interface 25, the control apparatus 20 may, for example, include a display device and a touch panel provided integrally with the display device. The processing to register information related to the storage cell 30 from the control apparatus 20 in the server 10 is described first. For example, a user A whose user ID is A uses the control apparatus 20A to manage the storage cells 30A and 30B. The user A starts to use the storage cell retrieval system when wishing to sell the storage cell 30A or 30B. The user A selects a storage cell icon from a management screen provided by the control apparatus 20A, such as the screen illustrated in FIG. 3. The control apparatus 20A then displays a menu screen such as the one in FIG. 4. Buttons to "sell", "add", and "replace" a storage cell are displayed on the menu screen. When the user A presses the "sell" button on the menu screen, an information disclosure confirmation screen related to the storage cell, such as the screen illustrated in FIG. 5, is displayed. When the user A performs an operation such as pressing the "yes" button on the confirmation screen, designating the storage cell to be sold, the sale price, and the like, the control apparatus 20A transmits a request to register the degradation state of the storage cells 30A and 30B to the server 10 based on the user operation. The degradation state of the storage cells 30A and 30B may be calculated after the "yes" button is pressed, or values calculated in advance may be used. FIG. 2 illustrates storage cell information stored in the database 14 of the server 10. Upon receiving the request, from the control apparatus 20A, to register the degradation state of the storage cells 30A and 30B that are control targets, the server 10 stores the degradation states in the database 14 as information with storage cell IDs 0001 and 0002. The storage cells 30A and 30B thus become retrieval targets in the storage cell retrieval system 1. When the SOH included in the information of the storage cells 30A and 30B is not updated for a predetermined period of time, the server 10 may transmit a request to update the degradation state of the storage cells 30A and 30B to the control apparatus 20A.

Retrieval of a storage cell by the server 10 based on a retrieval request from the control apparatus 20 is described next. For example, a user B whose user ID is B uses the control apparatus 20B to manage the storage cells 30C and 30D. The user B starts to use the storage cell retrieval system when wishing to add or replace a storage cell. The user B selects a storage cell icon from a management screen provided by the control apparatus 20B, such as the screen illustrated in FIG. 3. The control apparatus 20B then displays a menu screen such as the one in FIG. 4. When the user B performs an operation such as pressing the "add" button on the menu screen and designating the desired storage capacity of the storage cell to install, the control apparatus 20B determines a condition on the degradation state of the storage cell based on the degradation state of the storage cells 30C and 30D. For example, when the degradation state of the storage cell 30C is 50% and the degradation state of the storage cell 30D is 60%, the control apparatus 20B may use the degradation state of these two storage cells to determine that the condition on the degradation state is 50% or more to 60% or less. The control apparatus 20B transmits, to the server 10, a retrieval request to retrieve the new control target, the retrieval request including the condition on the degradation state of the storage cell. The control apparatus 20B may include the storage cell manufacturer ID, model, storage capacity, and the like of the storage cells 30C and 30D in the retrieval request. Upon receiving the retrieval request from the control apparatus 20B to retrieve a storage cell, the server 10 searches the database based on the received retrieval request. In addition to the condition on the degradation state included in the retrieval request, the server 10 may narrow down the retrieval targets based on conditions on the storage cell manufacturer ID, model, and storage capacity. The server 10 transmits the retrieval result including the retrieved information of the storage cell to the control apparatus 20B. Upon receiving the retrieval result including the information of the storage cell from the server 10, the control apparatus 20B displays a screen based on the retrieval result, such as the list of storage cells in FIG. 6. The list of storage cells in FIG. 6 may, for example, include a single storage cell that satisfies the conditions, such as item number 1, or a combination of two storage cells that satisfies the conditions, such as item number 2.

Finally, a transaction process by the server 10 to trade the storage cell 30 based on a transaction request from the control apparatus 20 is described. If a storage cell the user B wishes to trade is included on the retrieval result screen of FIG. 6, the user B presses the storage cell's "transaction start button". For example, if the user B presses the "transaction start button" of the storage cell in item number 1, the control apparatus 20B transmits a transaction request designating the storage cell 30A included in the retrieval result to the server 10. Upon receiving the transaction request, the server 10 transmits the transaction request to the control apparatus 20A that controls the storage cell 30A. Upon receiving the transaction request designating the storage cell 30A from the server 10, the control apparatus 20A displays a message indicating receipt of the transaction request on the management screen of FIG. 3, for example. When the user A responds to the transaction request, a transaction response is transmitted from the control apparatus 20A to the server 10. A transaction process then proceeds, including a payment process for the storage cell, a database update process, and transmission of a transaction completion notification to the control apparatuses 20A and 20B.

In the above-described operation example of the storage cell retrieval system 1, the notification interface 24 is a display device and the input interface 25 is a touch panel, but this example is not limiting. The notification interface 24 and the input interface 25 may be any apparatus used for providing information to the user and receiving input of information from the user. For example, the notification interface 24 may be a speaker for outputting audio. The input interface 25 may be a microphone for converting user speech into an electric signal. In this case, the control apparatus 20 may implement retrieval and transactions of storage cells with an interactive service that uses the microphone to receive an input operation by user speech and outputs the retrieval result with the speaker.

Figure 7:
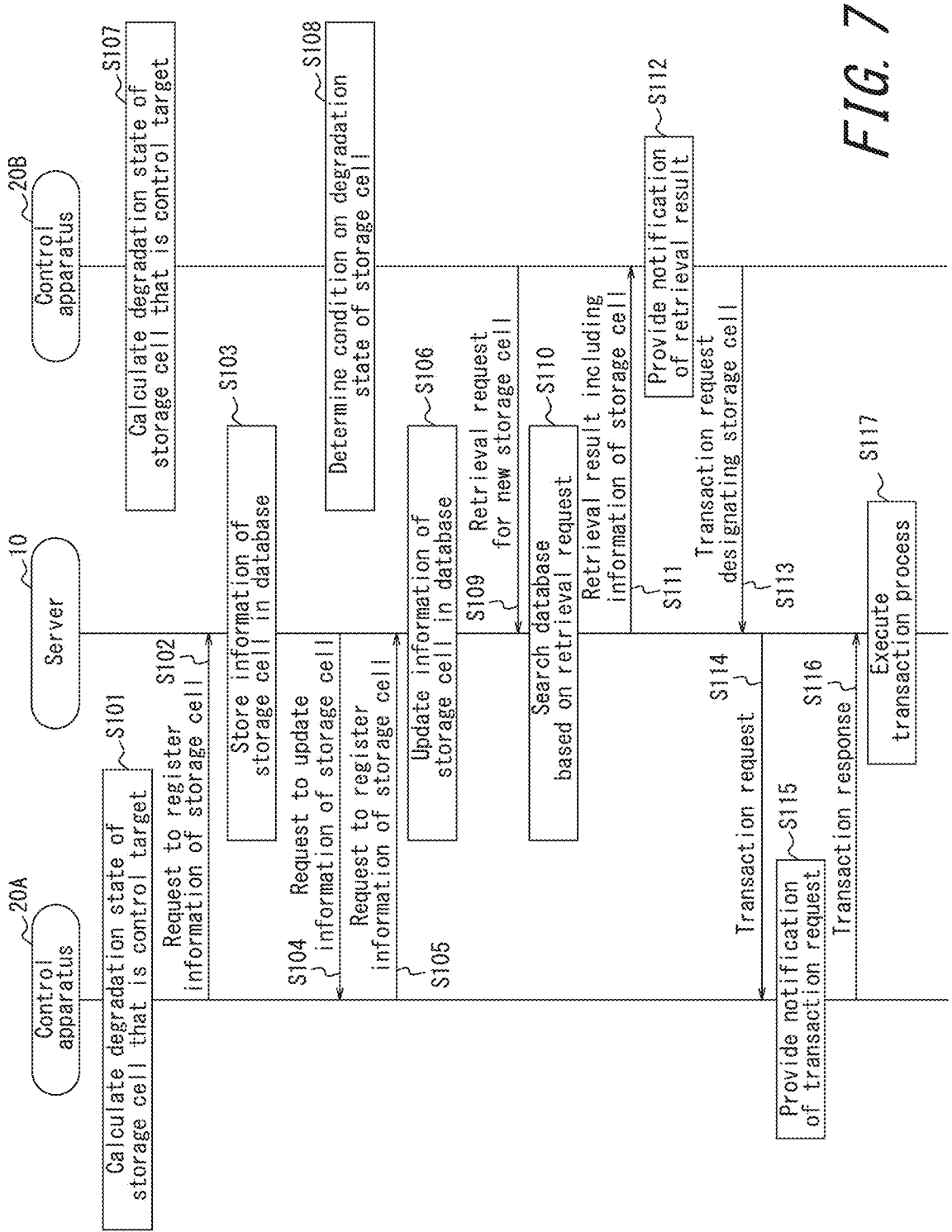
FIG. 7 is a flowchart illustrating an example of processing in the storage cell retrieval system of FIG. 1.

The processing flow in the storage cell retrieval system 1 according to an embodiment of the present disclosure is now described with reference to FIG. 7. For example, the control apparatus 20A registers a storage cell on the server 10, and the control apparatus 20B retrieves a storage cell from the server 10.

Step S101: the control apparatus 20A calculates the degradation state of the storage cells 30A and 30B that are control targets.

Step S102: the control apparatus 20A transmits a request to register the degradation state of the storage cells 30A and 30B that are control targets to the server 10.

Step S103: the server 10 stores storage cell information, including the degradation state of the storage cells 30A and 30B, received from the control apparatus 20A in the database.

Step S104: when the degradation state of the storage cell 30A or 30B has not been updated for a predetermined period of time, the server 10 transmits a request to update the degradation state of the storage cell 30A or 30B to the control apparatus 20A.

Step S105: the control apparatus 20A transmits a request to register the degradation state of the storage cells 30A and 30B that are control targets to the server 10.

Step S106: the server 10 updates the storage cell information in the database with the degradation state of the storage cells 30A and 30B received from the control apparatus 20A.

Step S107: the control apparatus 20B calculates the degradation state of the storage cells 30C and 30D that are control targets.

Step S108: the control apparatus 20B determines a condition on the degradation state of the storage cell to become the control target based on the degradation state of the storage cells 30C and 30D that are control targets.

Step S109: the control apparatus 20B transmits, to the server 10, a retrieval request to retrieve the storage cell to be a new control target, the retrieval request including the condition on the degradation state of the storage cell.

Step S110: the server 10 searches the database based on the retrieval request received from the control apparatus 20B.

Step S111: the server 10 transmits the retrieval result including the retrieved information of the storage cell to the control apparatus 20B.

Step S112: the control apparatus 20B provides notification of the retrieval result including the storage cell information received from the server 10.

Step S113: the control apparatus 20B transmits a transaction request designating the storage cell 30A included in the retrieval result to the server 10.

Step S114: upon receiving the transaction request designating the storage cell 30A from the control apparatus 20B, the server 10 transmits the transaction request to the control apparatus 20A that controls the storage cell 30A.

Step S115: the control apparatus 20A provides notification of the transaction request, designating the storage cell 30A, received from the server 10.

Step S116: the control apparatus 20A transmits a transaction response to the transaction request that designated the storage cell 30A to the server 10.

Step S117: upon receiving the transaction response, the server 10 executes a transaction process for the storage cell 30A.

As described above, the control apparatus 20 according to the present embodiment is capable of controlling the storage cell 30 and includes the controller 21 and the communication interface 22. The controller 21 determines, based on the degradation state of the storage cell 30 that is the control target, a condition on the degradation state of the storage cell. The communication interface 22 transmits, to the server 10, which is an information processing apparatus, a retrieval request to retrieve a storage cell to be a new control target, the retrieval request including the condition on the degradation state of the storage cell. The communication interface 22 receives, from the server 10, a retrieval result including information of the storage cell retrieved based on the retrieval request. This configuration enables provision of information of the storage cell that is to be a new control target to the user of the control apparatus 20 while taking into account the degradation state of other storage cells 30 already controlled by the control apparatus 20. When a new storage cell is installed and added to the control targets of the control apparatus 20, this reduces the probability that a difference in the degradation state, capabilities, or the like as compared to the other previously installed storage cells 30 will prevent the capabilities of the new storage cell, such as the storage capacity, from being sufficiently achieved. The usefulness of techniques for controlling storage cells thereby increases.

The control apparatus 20 according to the present embodiment calculates the degradation state of the storage cell 30 that is the control target. When the user retrieves information of a storage cell to be a new control target, this configuration can reduce the burden on the user for measurement and calculation of the degradation state of storage cells 30 already controlled by the control apparatus 20. The usefulness of techniques for controlling storage cells thereby increases.

A condition on the storage capacity of the storage cell is included in the retrieval request transmitted by the control apparatus 20 according to the present embodiment. With this configuration, the server 10 that receives the retrieval request can also retrieve a combination of storage cells that satisfy the condition on storage capacity in the retrieval request. This can provide the user with more options for storage cells to be the new control target, thereby increasing the usefulness of techniques for controlling storage cells.

The control apparatus 20 according to the present embodiment transmits a request to register the degradation state of the storage cell 30 that is the control target to the server 10 from the communication interface 22. This configuration enables the control apparatus 20 to be used not only for retrieving information of a storage cell to be a new control target but also for providing information of an unneeded storage cell 30 that is the control target of the control apparatus 20 to a person wishing to purchase a storage cell, for example. This promotes further use of used storage cells, thereby increasing the usefulness of techniques for controlling storage cells.

The control apparatus 20 according to the present embodiment receives a transaction request designating the storage cell that is the control target from the server 10 via the communication interface 22. This configuration enables the control apparatus 20 to notify the user of the control apparatus 20 that someone wishes to purchase the storage cell 30 that is the control target. This promotes further use of used storage cells, thereby increasing the usefulness of techniques for controlling storage cells.

The control apparatus 20 according to the present embodiment further includes the notification interface 24 that provides notification of information received from the server 10. At least one of a retrieval result and a transaction request is included in the information received from the server 10. With this configuration, a user wishing to retrieve or trade the storage cell 30 of the control apparatus 20 is notified of the information provided by the server 10. The usefulness of techniques for controlling storage cells thereby increases.

The control apparatus 20 according to the present embodiment further includes a display that displays information received from the server 10. With this configuration, information provided by the server 10 is rendered visible, and the user of the control apparatus 20 is notified of the information visually. The usefulness of techniques for controlling storage cells thereby increases.

The server 10, which is an information processing apparatus according to the present embodiment, communicably connects to a control apparatus capable of controlling a storage cell. The server 10 is configured to receive, from a first control apparatus 20, a registration request to register a degradation state of the storage cell 30 that is a control target of the first control apparatus 20, and when the registration request is received, to store the degradation state in a database including information of storage cells. The server 10 is configured to receive, from a second control apparatus 20, a retrieval request to retrieve a storage cell to be a new control target, the retrieval request including a condition on the degradation state of the storage cell 30, and when the retrieval request is received, to search the database based on the retrieval request and transmit, to the second control apparatus 20, a retrieval result including the information of the storage cell 30 that is retrieved. This configuration enables information of storage cells 30 that users no longer need and storage cells 30 that users desire to newly install to be shared on a plurality of control apparatuses 20. The usefulness of techniques for controlling storage cells thereby increases.

The server 10 according to the present embodiment is configured to receive, from the second control apparatus 20, a transaction request designating the storage cell 30 included in the retrieval result, and when the transaction request is received, to transmit the transaction request to the control apparatus 20 that controls the storage cell 30. This enables the control apparatus 20 not only to retrieve the storage cell 30 but also to perform a transaction with the retrieved storage cell 30. The usefulness of techniques for controlling storage cells thereby increases.

Although the present disclosure is based on embodiments and drawings, it is to be noted that various changes and modifications will be apparent to those skilled in the art based on the present disclosure. Therefore, such changes and modifications are to be understood as included within the scope of the present disclosure. For example, the configurations, functions, and the like included in the various means and steps may be reordered in any logically consistent way. Furthermore, means and steps may be combined into one, or individual means or steps may be divided.

For example, in the above embodiment, the server 10 has been described as including the database 14, but this configuration is not limiting. The server 10 need not include the database 14. In this case, the processing implemented by the database 14, such as storing and retrieving information, may be achieved using the server controller 11 and the server memory 13.

For example, in the above embodiment, a portion or all of the operations and processing executed by the control apparatus 20 may be executed by the server 10. Similarly, a portion or all of the operations and processing executed by the server 10 may be executed by the control apparatus 20. The processing such as display control of various screens displayed by the control apparatus 20 need not be executed by the server 10 and may be executed by cooperation between the server 10 and the control apparatus 20. Alternatively, the control apparatus 20 may execute the retrieval processing executed by the server 10. In this case, the server 10 may be limited to collecting and providing information of the storage cells 30 possessed by the various control apparatuses 20.

For example, the control apparatus 20 in the above embodiment is installed in a consumer facility along with the storage cell 30 that is the control target, but this configuration is not limiting. The control apparatus 20 may, for example, be connected to the storage cell 30 in a controllable manner via the network 40 such as the Internet. In this case, the control apparatus 20 may be installed in a remote location away from the storage cell 30 that is the control target.

At least a portion of the configuration and functions of the server 10 and the control apparatus 20 in the above embodiment may be implemented in another apparatus, for example. At least a portion of the configuration and functions of the communication interface 22, for example, may be implemented in an interface board connectable to the control apparatus 20. At least a portion of the configuration and functions of the memory 23, for example, may be implemented in an external storage apparatus connectable to the control apparatus 20. At least a portion of the configuration and functions of the notification interface 24, for example, may be implemented in a display apparatus or the like connectable to the control apparatus 20. At least a portion of the configuration and functions of the input interface 25, for example, may be implemented in an input apparatus or the like connectable to the control apparatus 20.

For example, the storage cell information stored in the database 14 of the server 10 in the above embodiment is not limited to the above-described example. Information indicating the type of storage cell, such as a nickel hydride battery, a lithium-ion battery, or a sodium sulfur battery, may be included in the storage cell information. Information on the positive electrode material, the negative electrode material, and the electrolyte may be included in the storage cell information. For example, when the storage cell is a lithium ion battery, then lithium iron phosphate ($LiFePO_4$), lithium manganate ($LiMn_2O_4$), lithium nickel oxide ($LiNiO_2$), lithium cobalt oxide ($LiCoO_2$), a ternary system ($Li(Ni-Mn-Co)O_2$), or the like may be registered as information on the positive electrode material, and graphite ($LiC_6$), lithium titanate ($Li_4Ti_5O_{12}$), or the like may be registered as information on the negative electrode material. These pieces of information enable the use of detailed storage cell characteristics for retrieval and transactions of storage cells that are more suitable for the user.

An example of using the degradation state and SOH of the storage cell as information indicating the degree of degradation of the storage cell has been described in the above embodiment, but this example is not limiting. Any information may be used as the information indicating the degree of degradation of the storage cell. For example, the electromotive force of the storage cell, the internal resistance, the storage capacity, or the like may be included in the information indicating the degree of degradation of the storage cell. These pieces of information enable retrieval and transactions of storage cells that are more suitable for the user.

In the example described in the above embodiment, various processes provided by the storage cell retrieval system 1 are implemented based on the degradation state of the storage cell, including registration of storage cell information, creation of retrieval conditions included in the retrieval request to retrieve a storage cell, and retrieval of the storage cell. This example, however, is not limiting. Various processes provided by the storage cell retrieval system 1 may be implemented based on any information related to the storage cell. For example, information indicating the degree of degradation of the storage cell, information indicating the capabilities of the storage cell, information indicating the configuration of the storage cell, or the like may be included in the information related to the storage cell. These pieces of information enable retrieval and transactions of storage cells that are more suitable for the user.

The invention claimed is:

1. A control apparatus for controlling a storage cell, the control apparatus comprising:
 a controller configured to determine, based on a degradation state of a first storage cell that is a control target, a condition of the degradation state of the first storage cell; and
 a communication interface configured to
  transmit, to an information processing apparatus, a first request to retrieve information of a second storage cell to be, in addition to or in place of the first storage cell, a new control target based on the condition of the degradation state of the first storage cell included in the first request, and
  receive, from the information processing apparatus, the information of the second storage cell retrieved based on the first request.

2. The control apparatus of claim 1, wherein the controller is further configured to calculate the degradation state of the first storage cell.

3. The control apparatus of claim 1, wherein the first request further includes a condition for a storage capacity of the second storage cell.

4. The control apparatus of claim 1, wherein the communication interface is further configured to transmit, to the information processing apparatus, a second request to register the degradation state of the first storage cell.

5. The control apparatus of claim 4, wherein the communication interface is further configured to receive, from the information processing apparatus, a third request designating the second storage cell.

6. The control apparatus of claim 1, further comprising a notification interface configured to provide notification of information received from the information processing apparatus.

7. The control apparatus of claim 1, further comprising a display configured to display information received from the information processing apparatus.

8. The control apparatus of claim 1, further comprising an input interface configured to receive an input requesting an additional storage cell or replacement of the first storage cell,
 wherein the controller is configured to determine, based on the degradation state of the first storage cell and the input, the condition of the degradation state of the first storage cell.

9. An information processing apparatus communicably connected to a control apparatus for controlling a storage cell, the information processing apparatus comprising:
 a communication interface configured to:
  receive, from a first control apparatus, a first request to register a degradation state of a first storage cell that is a control target of the first control apparatus;
  receive, from a second control apparatus, a second request to retrieve information of a second storage cell to be, in addition to or in place of the first storage cell, a new control target, the second request including a condition of the degradation state of the first storage cell; and
  transmit, to the second control apparatus, the information of the second storage cell; and
 a controller configured to,
  in response to the first request being received, store the degradation state of the first storage cell in the information processing apparatus, and
  in response to the second request being received, retrieve the information of the second storage cell from the information processing apparatus based on the condition of the degradation state of the first storage cell included in the second request.

10. The information processing apparatus of claim 9, wherein the communication interface is further configured to
 receive, from the second control apparatus, a third request designating the second storage cell included in the information, and
 in response to the third request being received, transmit the third request to the first control apparatus that controls the second storage cell.

11. A system, comprising:
 a control apparatus for controlling a storage cell, the control apparatus configured to
  determine, based on a degradation state of a first storage cell that is a control target, a condition of the degradation state of the first storage cell; and
  transmit, to an information processing apparatus, a first request to retrieve information of a second storage cell to be, in addition to or in place of the first storage cell, a new control target; and
 the information processing apparatus configured to
  communicably connect to the control apparatus;
  in response to the first request being received from the control apparatus, retrieve the information of the second storage cell based on the condition of the degradation state of the first storage cell included in the first request; and
  transmit, to the control apparatus, the information of the second storage cell.

\* \* \* \* \*